United States Patent [19]

Tsumura

[11] Patent Number: 4,821,944
[45] Date of Patent: Apr. 18, 1989

[54] METHOD FOR BONDING A WIRE AND BONDING APPARATUS

[75] Inventor: Kiyoaki Tsumura, Itami, Japan

[73] Assignee: Mitsubishi Denki Kabushiki Kaisha, Japan

[21] Appl. No.: 229,997

[22] Filed: Aug. 9, 1988

[30] Foreign Application Priority Data

Feb. 8, 1988 [JP] Japan .................. 63-25687

[51] Int. Cl.$^4$ .............................................. B23K 20/10
[52] U.S. Cl. ........................ 228/10; 228/111; 228/179; 228/230; 228/1.1; 228/4.5; 219/56.21; 219/9.5; 219/10.47; 219/10.53; 219/85.18
[58] Field of Search ............ 228/110, 111, 179, 230, 228/240, 1.1, 4.5; 219/85 F, 56.21, 9.5, 10.47, 10.53

[56] References Cited

U.S. PATENT DOCUMENTS

| 3,497,952 | 3/1970 | King et al. ............... 29/877 |
| 3,891,822 | 6/1975 | Laub et al. ............... 219/85 F |
| 4,315,128 | 2/1982 | Matcovich et al. ......... 228/4.5 |
| 4,586,642 | 5/1986 | Dreibelbis et al. ......... 228/4.5 |

FOREIGN PATENT DOCUMENTS

| 841863 | 7/1981 | Japan ................ 228/1.1 |
| 58-16540 | 1/1983 | Japan . |
| 143540 | 8/1983 | Japan ................ 228/4.5 |
| 158636 | 8/1985 | Japan ................ 228/4.5 |
| 20341 | 1/1986 | Japan ................ 228/4.5 |

Primary Examiner—Nicholas P. Godici
Assistant Examiner—Samuel M. Heinrich
Attorney, Agent, or Firm—Leydig, Voit & Mayer

[57] ABSTRACT

The method for bonding a wire of this invention comprises the steps of: positioning a metal ball or a wire on a material (to be bonded); applying a pressing force on the metal ball or the wire against the material (to be bonded) and deforming it; inducing eddy currents in the wire to generate heat energy, whereby elements of the wire and the material (to be bonded) are mutually diffused by means of the heat energy and the pressing force, and bonding is completed. The wire bonding apparatus of this invention comprises: a capillary tip having a through-hole which opens onto a end thereof and through which a wire is passed, the capillary tip pressing the wire against a material to be bonded by the end of the tip (flat face); an electromagnetic coil provided around the end of the capillary tip to surround the through-hole; and a power source for supplying a high-frequency current to the electromagnetic coil.

27 Claims, 4 Drawing Sheets

METHOD FOR BONDING A WIRE AND BONDING APPARATUS

BACKGROUND OF THE INVENTION

1. Field of the Invention

The present invention relates to a method for bonding a wire and a bonding apparatus, more particularly, to the method for bonding a metal wire onto a material (to be bonded), such as an aluminum electrode of a semiconductor chip, by means of a pressing force and heat energy.

2. Description of the Related Art

The method for bonding a wire described above is generally performed by the processes shown in FIGS. 4A to 4E.

After a copper ball 4 is formed on the end of the copper wire 2, which is 25 to 30 μm in diameter, which passes through a capillary tip 1, by the discharge energy of a torch electrode 3 (FIG. 4A), the capillary tip 1 is lowered to press the copper ball 4 against an aluminum electrode 8 of a semiconductor chip 7 attached to a die pad 6 of a copper lead frame 5 and is deformed plastically (FIG. 4B). During this time, the semiconductor chip 7 is heated to a temperature of 300° C. to 400° C. by a heat block 9 which the die pad 6 is placed on, and ultrasonic vibration is applied to the capillary tip 1 by a vibrating device (not shown), to diffuse metallic elements of the copper ball 4 and the aluminum electrode 8 mutually, and produce a bond between the copper ball 4 of the copper wire and the aluminum electrode 8. FIG. 5 shows the ball bonding area in large scale.

Next, the capillary tip 1 is raised, which causes the copper wire 2 to feed through the capillary tip 1 (FIG. 4C), and the tip is moved over and down to the surface 11 of the inner lead 10, and the copper wire 2 is then pressed against and bonded to the inner lead 10 (FIG. 4D). This is called the stitch bond and looping method. During this time, the inner lead 10 is heated to a temperature of 300° C. to 400° C. by the heat block 9 supporting the inner lead 10, and ultrasonic vibration is applied to the capillary tip 1 by the vibrating device (not shown), to mutually diffuse metallic elements of the copper wire 2 and the surface 11 of the inner lead 10 to produce a bond between the copper wire 2 and the surface 11 of the inner lead 10. FIG. 6 shows the stitch bonding area in large scale.

Thereafter, the clamper 12 is closed to clamp the wire 2. Next, the capillary tip 1 and clamper 12 are raised, whereby the copper wire 2 is pulled by the clamper 12 to sever the copper wire 2 (FIG. 4E).

Thus, the known wire bonding method described above is an ultrathermosonic bonding method. This method applies the pressing force, heat energy and ultrasonic vibration by the capillary tip 1 to provide for the mutual diffusion of the metal wire and the material (to be bonded). They are bonded with each other through the alloy layer. Ultrasonic vibration will work on the two metallic elements, the metal wire and the material (to be bonded), to diffuse these elements fast. Comparison between the above described ultrasonic bonding method and the thermocompression wire bonding method: This ultrathermosonic bonding method is superior to another wire bonding method known as thermocompression method from the time viewpoint. Specifically, since the thermocompression bonding method applies only a pressing force and heat energy, but for mass production of semiconductor devices, it is difficult to use.

Two different bonding samples were prepared; one was made by the ultrathermosonic bonding method and another was made by the thermocompression bonding method, and they were molded in an epoxy resin. While they had been stored at a high temperature from 150° C. to 250° C., the electric resistance of the bonding area had been measured. The results of these experiments indicated that the former bonding device resistance increased faster than the latter one. This has also been described in a report entitled "Reliability Evaluation of the bonding Au Wire and Al Electrode" in Technical Report NS-20568 issued in January in 1985 by Nippon Tsushin Gijutsu K.K.

It is not easy to deform the material plastically (to be bonded) by ultrathermosonic bonding method. For example, when the material (to be bonded) is an aluminum thin film electrode 8 such as shown in FIG. 5, the aluminum electrode 8 may be depressed under the metal ball and the contact area between the ball 4 and the aluminum electrode 8 may become smaller. This may result in bad electric conductivity, because a little corrosion of this bonding area will terribly reduce the bonding reliability and finally break this contact.

On the other hand, in the thermocompression bonding method; a pressing force and heat energy without ultrasonic vibration is applied. In this method, the higher the heat energy used, the shorter the bonding time required. But, with the heat block 9 heated to a higher temperature, there is a possibility that the bonding material between the die pad 6 and the semiconductor chip 7 may become softened or decomposed, and that the semiconductor chip 7 may become functionally damaged. Accordingly, it has been difficult to reduce the bonding time required.

SUMMARY OF THE INVENTION

A major object of the present invention is to solve the above-described problems of the conventional art, and to provide a method for bonding a wire and a bonding apparatus which can realize high reliability bonding in a short period of time.

To realize this object, the present invention provides a wire bonding method which comprises the steps of: positioning a metal ball formed at the end of the wire over a material (to be bonded); pressing this ball against the material; and applying heat energy by inducing an eddy current in the wire near the ball; whereby the element of the ball and the material (to be bonded) are mutually diffused.

The present invention also provides a wire bonding apparatus which comprises: a capillary tip having a through-hole through which the wire is passed for pressing the wire against a material (to be bonded); an electromagnetic coil equipped about the end of the capillary tip; and a power source for supplying a high-frequency current to the electromagnetic coil.

In the present invention, the high-frequency current is supplied from the power source to the electromagnetic coil to induce eddy currents and to generate heat energy with rapidity in the wire itself through the capillary tip. This heat energy can realize a high speed bonding of the wire and the material (to be bonded).

DESCRIPTION OF THE PREFERRED EMBODIMENTS

The present invention will be described below by way of an example with reference to the accompanying drawings.

Figure 1:
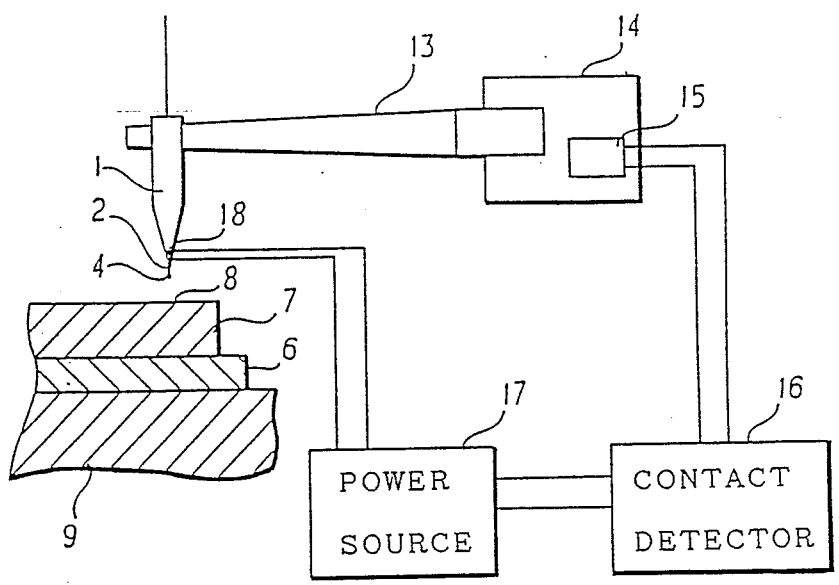
FIG. 1 is a block diagram of a wire bonding apparatus, showing an embodiment of the present invention.

Referring first to FIG. 1, a capillary tip 1 is provided on an arm 13, and a driving device 14 can move the tip up and down. A contact detector 16 can detect the contact of a copper wire or a copper ball passed through the capillary tip 1 with the material (to be bonded) by a sensor 15 of the driving device 14. A high-frequency current oscillating power source 17 is connected to the contact detector 16 and an electromagnetic coil 18 equipped on the capillary tip 1. When the contact detector 16 detects the contact of the copper wire with the material (to be bonded), the power source 17 supplies a high-frequency current at a frequency between 60 MHz and 800 MHz and at an output power between 100 mW and 2 W to the electromagnetic coil 18 for the predetermined period of time.

Figure 2:
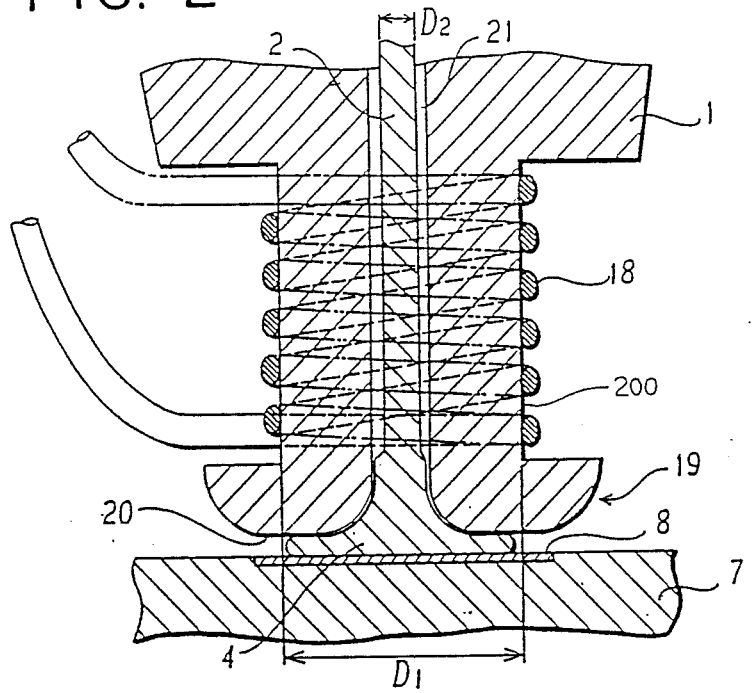
FIGS. 2 and 3 are respectively cross-sectional views of the end portion of a capillary tip of the apparatus of FIG. 1 in bonding a wire.

FIG. 2 shows the cross-sectional structure of the end portion of the capillary tip 1. An end portion 19 of the capillary tip 1 has a flat loading surface 20 and a through hole 21 for passing a copper wire 2 through the center thereof. The through hole 21 opens onto the loading surface 20.

A column part 200 having a diameter D1 is formed around the end portion of the capillary tip 1. An electromagnetic coil 18 is wound around the column 200 to surround the through hole 21. The electromagnetic coil 18 is formed of an insulation coated copper wire, 20 μm in diameter, and the central axis of the coil winding coincides with that of the through hole 21. The diameter D1 of the column 200 is 1.5 times larger than that of the diameter D2 of the copper wire used, and is 300 μm or less.

It is possible to bond a wire using similar processes to those shown in FIGS. 4A to 4E by using the above-described wire bonding apparatus.

First, the copper wire 2 between 25 to 30 μm in diameter is passed through the through-hole 21 of the capillary tip 1, and a copper ball 4 is formed at the end of the copper wire 2 by heating with a torch 3. Next, the capillary tip 1 is lowered along with the arm 13 by the driving device 14 until the copper ball 4 contacts with an aluminum electrode 8 (a material to be bonded) of a semiconductor chip 7 on a die pad 6.

When the contact detector 16 detects the contact of the copper ball 4 with the aluminum electrode 8 from the signal of he sensor 15 in the driving device 14, a detection signal is transfered from the contact detector 16 to the power source 17, and the power source 17 supplies a high-frequency current to the electromagnetic coil 18 of the capillary tip 1 for a predetermined period of time. An alternating magnetic field, whose direction and intensity periodically varies, is generated by the electromagnetic coil 18 and an inverse alternating eddy current is induced in the copper wire 2 to diminish the magnetic field itself. In consequence, the electric resistance of the copper wire 2 generates heat energy in the wire 2 and the heat energy is conducted to the squashed copper ball 4.

While the high-frequency current is being supplied to the electromagnetic coil 18, the capillary tip 1 is further lowered by the driving device 14 to apply pressure to the copper ball 4.

As a result, the copper ball 4 is plastically deformed as shown in FIG. 2, and the two metallic elements of the copper ball 4 and the aluminum electrode 8 are mutually diffused by means of the heat energy and the pressing force, and they are bonded.

As described above, since the heat energy is generated in the copper wire 2 by the eddy current, the temperature of the heat block 9 heating the semiconductor chip 7 is kept about 25° C. to 280° C. which is enough to provide the best bonding.

Next, after the capillary tip 1 is raised, which causes the copper wire 2 to feed through the tip 1, the tip 1 is moved over and down to the surface 11 of the inner lead 10. Next, the wire 2 is pressed against and bonded to the inner lead 10. This is called the stitch bond and looping method.

During this time, as in the case of bonding of the copper ball 4 onto the aluminum electrode 8, when the contact detector 16 detects the contact of the copper wire 2 with the inner lead 10, the power source 17 supplies a high-frequency current to the electromagnetic coil 18 of the capillary tip 1 for a predetermined period of time. A magnetic field is generated by the electromagnetic coil 18 and an eddy current is induced in the copper wire 2. In consequence, the electric resistance of the copper wire 2 generates heat energy within itself. While the high-frequency current is being supplied to the electromagnetic coil 18, the capillary tip 1 is further lowered by the driving device 14 applying a pressing force to the copper wire 2 caught between the capillary tip 1 and the inner lead 10.

Figure 3:
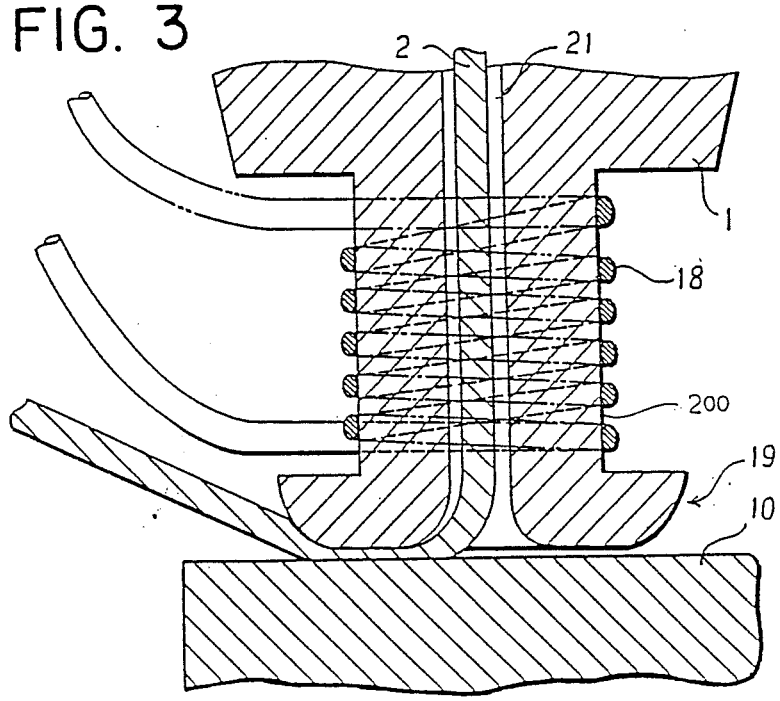
Figure 4A:
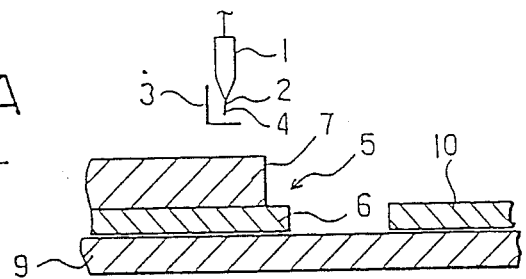
FIGS. 4A to 4E show the processes of a typical wire bonding method.
Figure 4B:
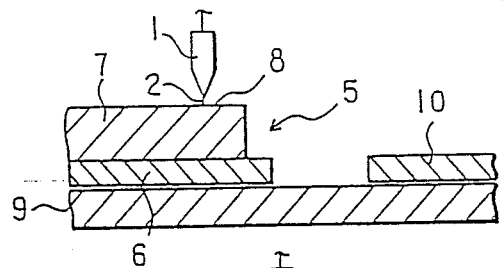
Figure 4C:
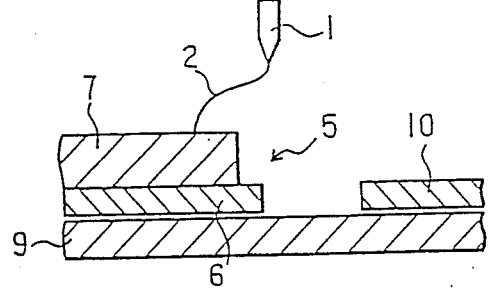
Figure 4D:
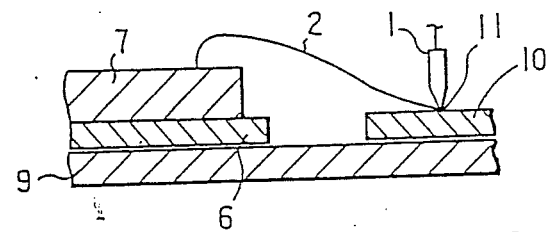
Figure 4E:
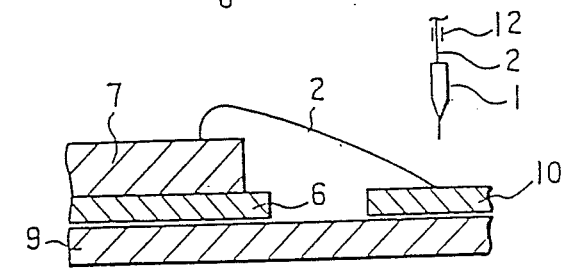
Figure 5:
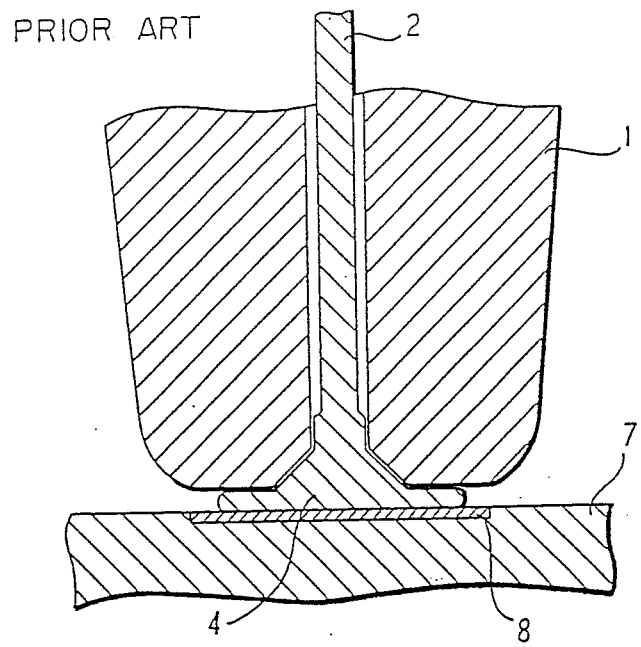
FIGS. 5 and 6 are respectively cross-sectional views of the end portion of a known capillary tip in bonding a wire.
Figure 6:
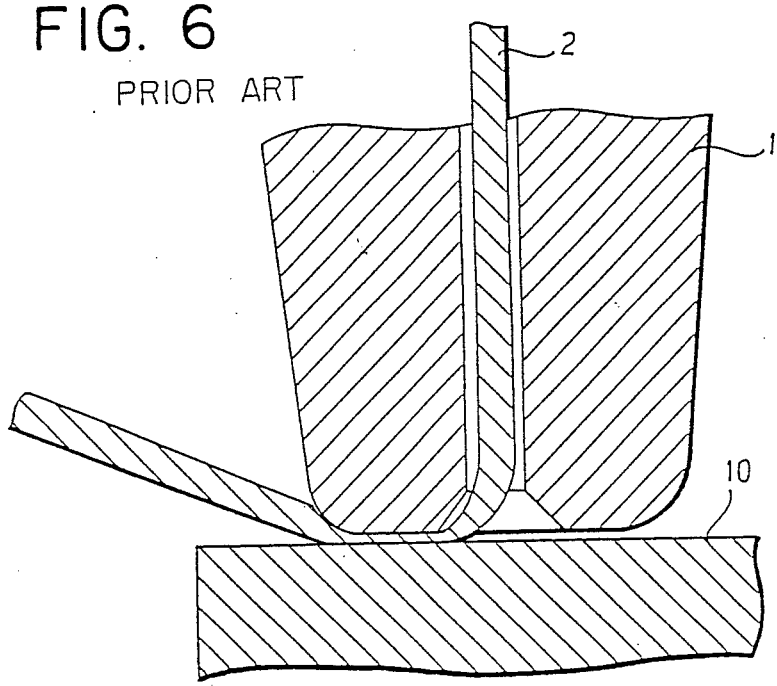

As a result, the copper wire 2 is plastically deformed, as shown in FIG. 3, and the two metallic elements of the copper wire 2 and the inner lead 10 are mutually diffused by means of the heat energy and the pressing force, and they are bonded. During this time, the temperature of the heat block 9 heating the inner lead 10 is kept at about 25° C. to 280° C.

Thereafter, the clamper is closed to clamp the wire 2. Next, the capillary tip 1 and the clamper are raised, whereby the copper wire 2 is pulled by the clamper to sever the copper wire 2.

Thus, a high reliable bonding whose contact area is large enough can be carried out in a short time.

The above described embodiment employs a copper wire 2. However, this invention can also be applied to metal wires made of gold, aluminum or the like. Further, iron or its alloy can be employed as a lead frame in place of copper or its alloy. Still further, many metals, e.g., gold, silver, copper or aluminum, can be employed as an electrode of the semiconductor chip and a surface metal of an inner lead.

Preferably, the capillary tip 1 is formed of an insulating material, such as alumina, sapphire, alumina zirconia, silicon nitride or silicon carbide, so a magnetic field is not induced in the capillary tip 1 by the electromagnetic coil 18.

The electromagnetic coil 18 may also be formed by winding a tungsten wire in place of a copper wire. In order to generate an induced current more effectively in the wire 2, the smaller the coil diameter of the electromagnetic coil 18, the better. Therefore, the electromagnetic coil 18 may be buried in the capillary tip 11. In that case, a copper or tungsten coil is first formed on the surface of the insulation that constitutes the capillary tip 1 by printing, deposition, or sputtering and then the coil is covered over all with the insulation.

Further, the sensor 15 may also be arranged so as to detect the applied load on the arm 13 instead of the position of the arm 13, the contact detector 16 may use the signal delivered from the sensor 15 to detect the contact of the wire with the material (to be bonded). Alternatively, an optical sensor may be used as the sensor 15 to optically detect the position of the wire 2 and the material (to be bonded), the contact detector 16 can also detect the contact by the signal delivered from the sensor 15.

As will be understood from the foregoing description, it is possible to bond a wire at a lower temperature of the heat block than before. This means that it is possible to prevent the peripheral members from oxidizing or out-gassing of the die bonding material (resin), and to provide excellent devices having high reliability.

Further, since the material with which the wire is to be bonded is less affected by the heat, it is possible to apply wire bonding to a wider variety of devices. In particular, the present invention makes it possible to bond a wire on a lead frame which has already been plated along the outer lead. Therefore, the semiconductor assembly production processes may be decreased, and production cost may be reduced.

What is claimed is:

1. A method for bonding a wire comprising the steps of:
   a. positioning a metal ball formed at an end of a wire over a material to be bonded;
   b. pressing said metal ball against said material to be bonded and plastically deforming said ball on said material to be bonded; and
   c. generating heat energy by inducing an eddy current in a portion of said wire above said deformed metal ball,
   whereby elements of said metal ball and said material to be bonded are mutually diffused by means of said heat energy and said pressing force.

2. A method for bonding a wire according to claim 1, wherein said material to be bonded is heated to a temperature of 25° C. to 280° C.

3. A method for bonding a wire according to claim 1, wherein said wire is mainly composed of copper.

4. A method for bonding a wire according to claim 1, wherein said wire is mainly composed of gold.

5. A method for bonding a wire according to claim 1, wherein said wire is mainly composed of aluminum.

6. A method for bonding a wire comprising the steps of:
   a. positioning a bonding portion of a wire over a material to be bonded;
   b. pressing said bonding portion of said wire against said material to be bonded and plastically deforming said bonding portion on said material to be bonded; and
   c. generating heat energy by inducing an eddy current in a portion of said wire above said deformed bonding portion of said wire,
   whereby elements of said bonding portion of said wire and said material to be bonded are mutually diffused by means of said heat energy and said pressing force.

7. A method for bonding a wire according to claim 6, wherein said material to be bonded is heated to a temperature of 25° C. to 280° C.

8. A method for bonding a wire according to claim 6, wherein said wire is mainly composed of copper.

9. A method for bonding a wire according to claim 6, wherein said wire is mainly composed of gold.

10. A method for bonding a wire according to claim 6, wherein said wire is mainly composed of aluminum.

11. A wire bonding apparatus comprising:
    a. a capillary tip having a through-hole which opens onto an end thereof and through which a metal wire is passed for pressing against a material to be bonded to the end of said wire;
    b. an electromagnetic coil disposed around said capillary tip and surrounding said through-hole at the end portion of said tip; and
    c. a power source for supplying a high-frequency current to said electromagnetic coil.

12. A wire bonding apparatus according to claim 11, wherein said capillary tip is an insulator.

13. A wire bonding apparatus according to claim 12, wherein said insulator is alumina.

14. A wire bonding apparatus according to claim 12, wherein said insulator is sapphire.

15. A wire bonding apparatus according to claim 12, wherein said insulator is alumina zirconia.

16. A wire bonding apparatus according to claim 12, wherein said insulator is silicon nitride.

17. A wire bonding apparatus according to claim 12, wherein said insulator is silicon carbide.

18. A wire bonding apparatus according to claim 11, wherein said electromagnetic coil is copper.

19. A wire bonding apparatus according to claim 11, wherein said electromagnetic coil is tungsten.

20. A wire bonding apparatus according to claim 11, wherein said electromagnetic coil has a diameter of 300 $\mu$m or less, and said electromagnetic coil has a diameter 1.5 times larger than the diameter of said wire.

21. A wire bonding apparatus according to claim 11, wherein said electromagnetic coil is wound around the outer periphery of said capillary tip.

22. A wire bonding apparatus according to claim 11, wherein said electromagnetic coil is buried in said capillary tip.

23. A wire bonding apparatus according to claim 22, wherein said electromagnetic coil is made by means of printing.

24. A wire bonding apparatus according to claim 22, wherein said electromagnetic coil is made by means of deposition.

25. A wire bonding apparatus according to claim 22, wherein said electromagnetic coil is made by means of sputtering.

26. A wire bonding apparatus according to claim 11, wherein said electromagnetic coil and said through hole have a common central axis.

27. A wire bonding apparatus according to claim 11, wherein said power source supplies a high-frequency current at a frequency ranging between 60 MHz and 800 MHz and at an output power ranging between 100 mW and 2 W.

* * * * *